(12) United States Patent
Shinohara et al.

(10) Patent No.: US 11,605,722 B2
(45) Date of Patent: Mar. 14, 2023

(54) OHMIC CONTACT FOR MULTIPLE CHANNEL FET

(71) Applicant: Teledyne Scientific & Imaging, LLC, Thousand Oaks, CA (US)

(72) Inventors: Keisuke Shinohara, Thousand Oaks, CA (US); Casey King, Newbury Park, CA (US); Eric Regan, Moorpark, CA (US)

(73) Assignee: Teledyne Scientific & Imaging, LLC, Thousand Oaks, CA (US)

( * ) Notice: Subject to any disclaimer, the term of this patent is extended or adjusted under 35 U.S.C. 154(b) by 53 days.

(21) Appl. No.: 16/877,378

(22) Filed: May 18, 2020

(65) Prior Publication Data
US 2021/0359097 A1 Nov. 18, 2021

(51) Int. Cl.
| | |
|---|---|
| *H01L 29/778* | (2006.01) |
| *H01L 29/45* | (2006.01) |
| *H01L 29/66* | (2006.01) |
| *H01L 29/20* | (2006.01) |
| *H01L 29/49* | (2006.01) |

(52) U.S. Cl.
CPC ........ *H01L 29/452* (2013.01); *H01L 29/2003* (2013.01); *H01L 29/454* (2013.01); *H01L 29/495* (2013.01); *H01L 29/66462* (2013.01); *H01L 29/7783* (2013.01); *H01L 29/7786* (2013.01); *H01L 29/7787* (2013.01)

(58) Field of Classification Search
CPC ...................................................... H01L 29/495
See application file for complete search history.

(56) References Cited

U.S. PATENT DOCUMENTS 5,831,296 A * 11/1998 Kuroda ............... H01L 29/7783
  257/194
9,419,121 B1 8/2016 Teo et al.
(Continued)

FOREIGN PATENT DOCUMENTS

EP 3506364 A2 7/2019

OTHER PUBLICATIONS

Ma, J. "Multi-channel tri-gate normally-on/off AlGaN/GaN MOSHEMTs on Si substrate with high breakdown voltage and low ON-resistance" App. Phys Lett. 113 Oct. 12, 2018 pp. 242102-1 through 242102-5 (Year: 2018).*

(Continued)

*Primary Examiner* — Grant S Withers
(74) *Attorney, Agent, or Firm* — M.J. Ram & Associates

(57) ABSTRACT

An ohmic contact for a multiple channel FET comprises a plurality of slit-shaped recesses in a wafer on which a multiple channel FET resides, with each recess having a depth at least equal to the depth of the lowermost channel layer. Ohmic metals in and on the sidewalls of each recess provide ohmic contact to each of the multiple channel layers. An ohmic metal-filled linear connecting recess contiguous with the outside edge of each recess may be provided, as well as an ohmic metal contact layer on the top surface of the wafer over and in contact with the ohmic metals in each of the recesses. The present ohmic contact typically serves as a source and/or drain contact for the multiple channel FET. Also described is the use of a regrown material to make ohmic contact with multiple channels, with the regrown material preferably having a corrugated structure.

14 Claims, 5 Drawing Sheets

(56) References Cited

U.S. PATENT DOCUMENTS

| | | | |
|---|---|---|---|
| 2010/0052014 A1* | 3/2010 | Matsushita | H01L 29/7787 |
| | | | 257/192 |
| 2011/0233520 A1 | 9/2011 | Jeon et al. | |
| 2014/0264273 A1 | 9/2014 | Howell et al. | |
| 2017/0271460 A1* | 9/2017 | Chang | H01L 29/66462 |
| 2017/0323941 A1 | 11/2017 | Obradovic et al. | |
| 2019/0058042 A1* | 2/2019 | Then | H01L 29/2003 |
| 2019/0259866 A1 | 8/2019 | Teo et al. | |
| 2019/0288101 A1* | 9/2019 | Longobardi | H01L 29/4236 |
| 2020/0411663 A1* | 12/2020 | Saptharishi | H01L 29/66462 |

OTHER PUBLICATIONS

Jun Ma et al., "Multi-channel tri-gate normally-on/off AlGaN/GaN MOSHEMTs on Si substrate with high breakdown voltage and low ON_resistance", Appl. Phys. Lett. 113, 242102 (2018).

Keisuke Shinohara et al., "Scaling of GaN HEMTs and Schottky Diodes for Submillimeter-Wave MMIC Applications", IEEE Transactions on Electron Devices, vol. 60, No. 10, p. 2982-2996, Oct. 2013.

International Search Report and Written Opinion in International Application No. PCT/US2021/029758 dated Aug. 3, 2021.

* cited by examiner

OHMIC CONTACT FOR MULTIPLE CHANNEL FET

GOVERNMENT RIGHTS

This invention was made with Government support under FA8650-18-C-7807 awarded by DARPA DREAM. The Government has certain rights in the invention.

BACKGROUND OF THE INVENTION

Field of the Invention

This invention relates generally to ohmic contacts, and more particularly to ohmic contacts for multiple channel field effect transistors (FETs).

Description of the Related Art

Field effect transistors (FETs) consisting of a multiple (stacked) channel structure, have drawn attention recently for increased current density and reduced on-resistance for power amplifier and power switch applications. For a single channel FET, conventional alloyed ohmic contacts are formed by annealing a stack of thin metal layers (such as Ti/Al/Mo/Au for GaN FETs, AuGe/Ni/Au for GaAs/InGaAs FETs); the sunk metals form an ohmic contact to the channel layer. However, this method does not work well for multi-channel FET structures, where the distance between the top semiconductor surface and the stacked channels is larger, because the alloyed metals do not reach the deep channels. This results in high contact resistance for multi-channel transistors.

"Regrown" ohmic contacts are another technology used to form low-resistance ohmic contacts. A low ohmic contact resistance in laterally regrown n$^+$GaN on a single 2DEG channel has been demonstrated. However, contact resistance in a multiple channel FET may be higher than desired.

SUMMARY OF THE INVENTION

An ohmic contact for a multiple channel FET is presented. In one possible embodiment, the present ohmic contact comprises a plurality of slit-shaped recesses in a wafer on which a multiple channel FET resides, with each recess having a depth at least equal to the depth of the lowermost channel layer of the FET. The recesses are aligned linearly with each other, with the line of recesses oriented perpendicular to the direction of current flow between the FET's source and drain. Ohmic metals in and on the sidewalls of each slit-shaped recess provides ohmic contact to each of the multiple channel layers. The sidewalls are preferably sloped, with the angle of the sidewalls being between 45° and 90°.

Each of the slit-shaped recesses has an inside edge which current flows to or from and an outside edge. In a preferred embodiment, a linear connecting recess which is contiguous with the outside edge of each of the slit-shaped recesses is provided. Ohmic metals are also deposited in the linear connecting recess such that they interconnect the slit-shaped recesses and the linear connecting recess with the multiple channel layers.

The present ohmic contact may also include an ohmic metal contact layer on the top surface of the wafer over and in contact with the ohmic metals in each of the recesses in the line of recesses, as well as over the linear connecting recess (if present).

The present ohmic contact typically serves as a source and/or drain contact for a multiple channel FET. The FET may be, for example, a GaN FET, with ohmic metals comprising Ti, Al, Mo, and/or Au. Another example would be a GaAs/InGaAs FET, with ohmic metals comprising AuGe, Ni, and/or Au. Additional examples are provided below.

These and other features, aspects, and advantages of the present invention will become better understood with reference to the following drawings, description, and claims.

DETAILED DESCRIPTION OF THE INVENTION

As an overview, in one possible embodiment, the present ohmic contact, intended for use with FETs having a multiple (stacked) channel structure, is formed by recess etching small slit patterns prior to ohmic metal deposition. The recesses are made deeper than the depth of the bottom channel layer. Ohmic metals are directly deposited onto the sidewalls of each recess, thereby forming simultaneous contact to each channel. The length, width, and shape of the slit structure is preferably optimized based on the materials' sheet resistance and the lateral contact resistance between the metal and the channel, so that overall contact resistance is minimized.

Also described is a similar concept applied to more recent regrown ohmic contact technology, where a regrown material makes ohmic contact with the sidewalls of multiple channels. As describes herein, the regrown material preferably has a corrugated structure, which increases contact area by increasing contact periphery two dimensionally, thereby decreasing effective contact resistance. The length, width, and shape of the corrugated structure is preferably optimized based on the materials' sheet resistance and the lateral contact resistance between the metal and the channel, so that overall contact resistance is minimized.

Figure 1:
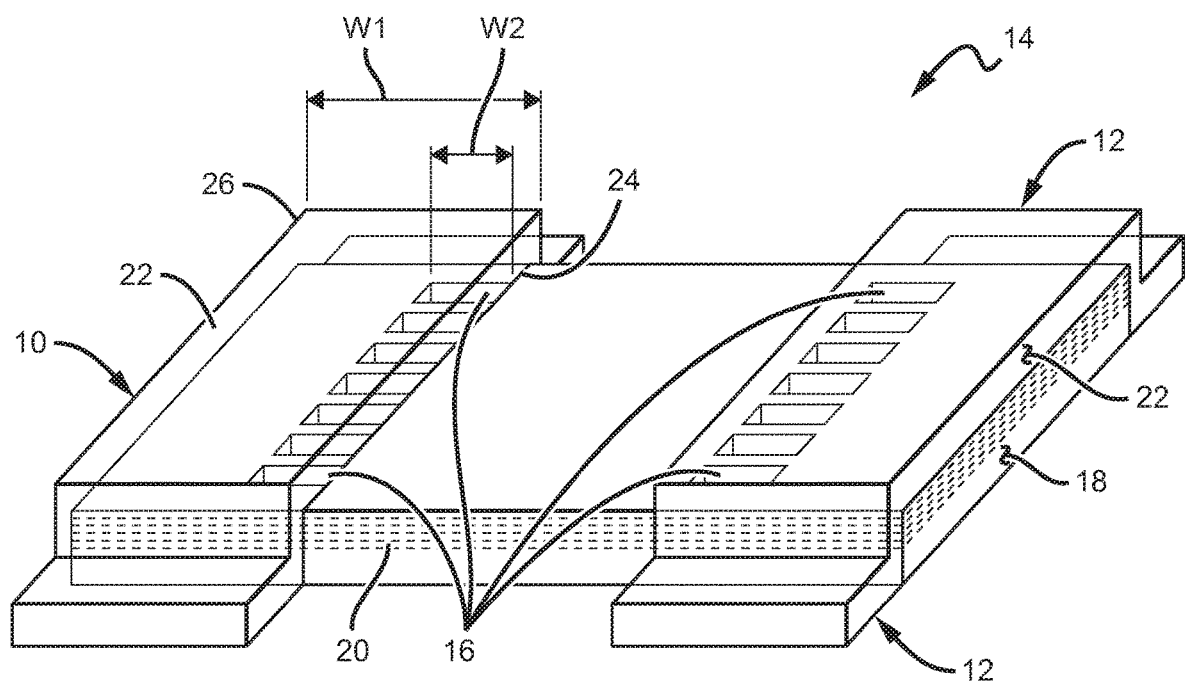
FIG. 1 is a perspective view of one embodiment of a multiple channel FET employing ohmic contacts in accordance with the present invention.

One possible embodiment of the "slit pattern" approach is illustrated in FIG. 1, in which ohmic contacts 10, 12 (source and drain) are provided for a multiple channel FET 14. Each ohmic contact comprises a plurality of slit-shaped recesses 16 in a wafer 18 on which a multiple channel FET resides. Each recess 16 has a depth at least equal to the depth of the lowermost channel layer 20 of the FET, with the recesses aligned linearly with each other. The line of recesses is oriented perpendicular to the direction of current flow between the FET's source and drain. Ohmic metals (not numbered) are in and on the sidewalls of each of the slit-shaped recesses such that ohmic contact is made to each of the multiple channel layers—with contact to the channel layers being made laterally. The width and pitch of the slits is preferably chosen to optimize material conductivity and interfacial resistance.

The present ohmic contact may further comprise an ohmic metal contact layer 22 on the top surface of wafer 18 over and in contact with the ohmic metals in each of the recesses 16. The ohmic metal contact layer 22 has an inside edge 24 and an outside edge 26; the line of recesses 16 is preferably set back from the ohmic metal contact layer's inside edge 24 by a distance ≥0 μm such that each of the recesses is completely overlapped (covered) by the ohmic metal contact layer.

Figure 2:
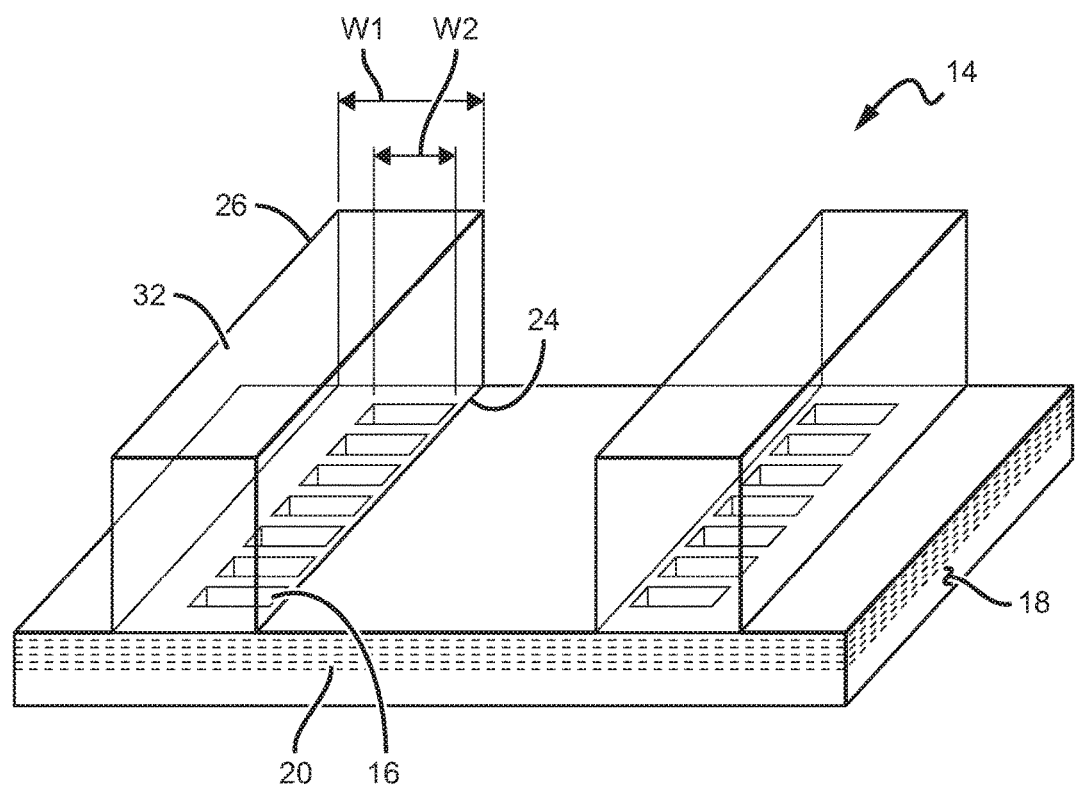
FIG. 2 is a perspective view of another possible embodiment of a multiple channel FET, employing narrow ohmic contacts in accordance with the present invention.

Ohmic metal contact layer 22 has an associated width W1 defined as the distance between inside edge 24 and outside edge 26. Each of recesses 16 also has an associated common width W2 defined in the same direction as W1. The minimum value for W1 is preferably equal to W2. W1 can be considerably greater than W2, as illustrated in FIG. 1. Alternatively, as illustrated in FIG. 2, ohmic metal contact layer 32 can be relatively narrow—with a width W1 equal or nearly equal to W2.

Figure 3A:
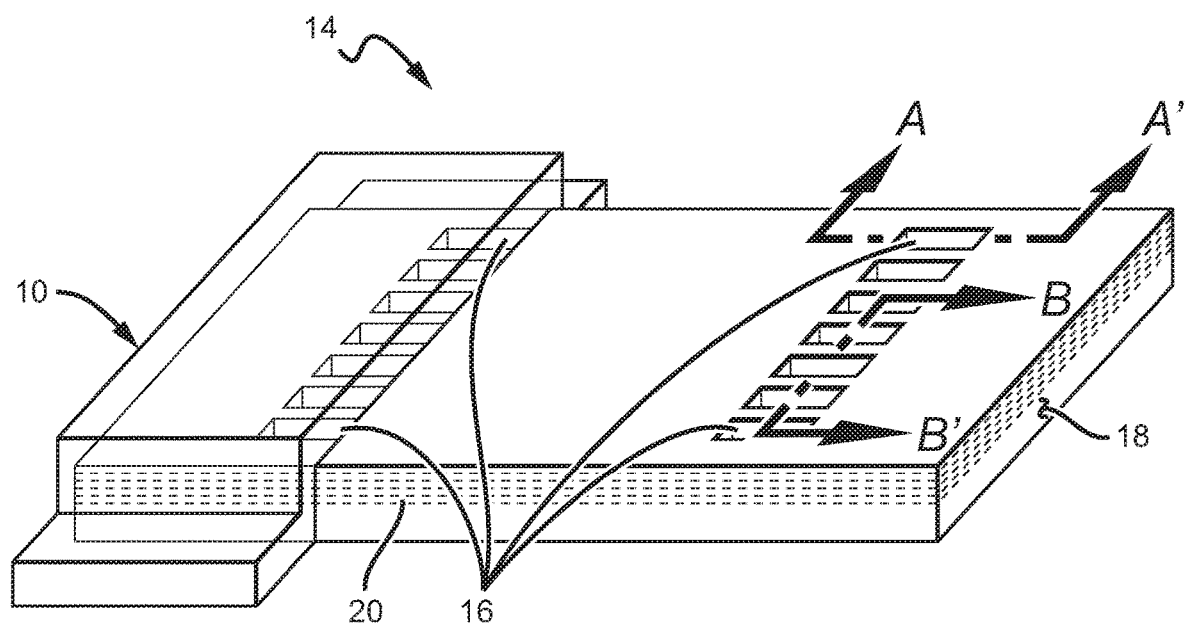
FIG. 3A is a perspective view of one embodiment of a multiple channel FET employing ohmic contacts in accordance with the present invention, and which depicts section lines A-A' and B-B' in a recess.
Figure 3B:
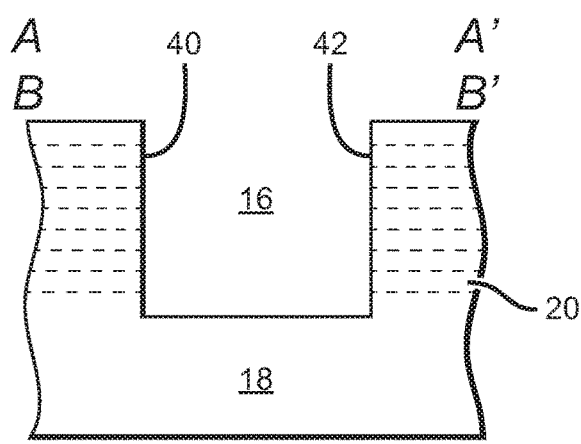
FIGS. 3B and 3C are two possible cross-sectional views of a recess, resulting from section lines A-A' and B-B' in FIG. 3A.
Figure 3C:
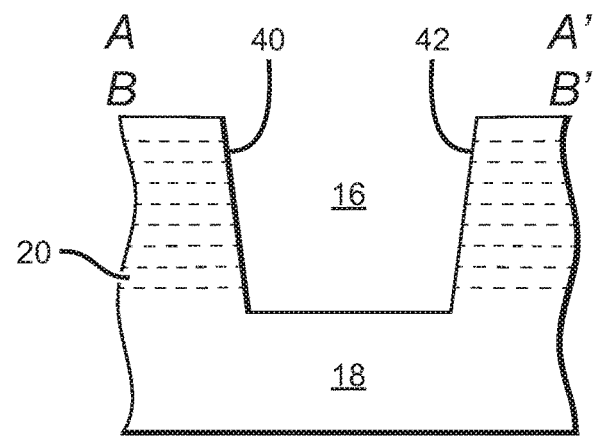

FIG. 3A shows a multiple channel FET 14 as described herein, with the cross-sectional views (taken along section lines A-A' and B-B') shown in FIGS. 3B and 3C illustrating possible shapes for the sidewalls 40, 42 of recesses 16. As shown in FIG. 3A, sidewalls 40,42 may be vertical. However, in FIG. 3B, sidewalls 40, 42 are sloped, with the angle of the sidewalls preferably being between 45° and 90°.

Figure 4A:
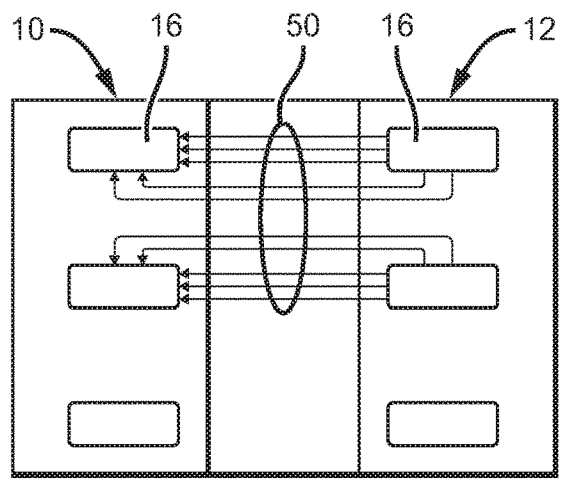
FIGS. 4A and 4B are plan views of two possible embodiments of a multiple channel FET employing ohmic contacts in accordance with the present invention, showing potential current paths between contacts.
Figure 4B:
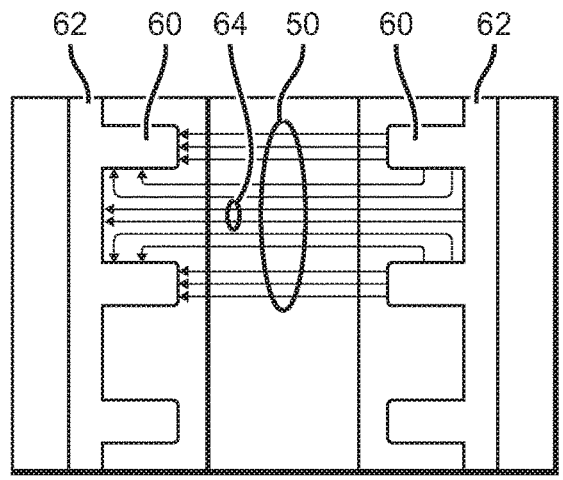

When arranged as shown in FIG. 1, current paths 50 are formed between ohmic contacts 10 and 12—formed as described above with slit-shaped recesses 16—as shown in FIG. 4A. Another possible embodiment is shown in FIG. 4B. As before, slit-shaped recesses 60 are formed. In addition, linear connecting recesses 62 are formed which are contiguous with the outside edge of each of slit-shaped recesses 60. Ohmic metals fill both linear connecting recess 62 and recesses 60 such that the slit-shaped recesses and linear connecting recess of each ohmic contact are interconnected with the multiple channel layers. Now, in addition to current paths 50, additional current paths 64 are provided between linear connecting recesses 60.

Note that at least two different embodiments are contemplated for an ohmic contact with a linear connecting recess as shown in FIG. 4B. For example, in the configuration shown in FIG. 5A, an ohmic contact layer 66 is over and in contact with the ohmic metals in each of the recesses 60 and 62. As before, the line of recesses 60 is preferably set back from the ohmic metal contact layer's inside edge 68 by a distance ≥0 μm such that each of the recesses is completely covered by ohmic metal contact layer 66. Alternatively, as shown in FIG. 5B, no ohmic metal contact layer is provided over recesses 60 and 62.

The present ohmic contacts can be used with multiple channel FETs made from various materials. For example, the multiple channel FET may be a n-type AlGaN/GaN FET; here, suitable ohmic metals comprise Ti, Al, Mo, and/or Au; for a p-type AlGaN/GaN FET, Pd, Ni, Pt and/or Au are suitable ohmic metals. As another example, the multiple channel FET may be a GaAs/InGaAs FET; here, suitable ohmic metals comprise AuGe, Ni, and/or Au. Another example is an $AlGa_2O_3/Ga_2O_3$ FET; here, suitable ohmic metals comprise Ti and Au. In general, the ohmic metals should be chosen to provide a desired contact resistance; this would typically be empirically determined.

Note that, though multiple channel FETs are described as the primary application of the present ohmic contact, they can more generally find application with any FET having one or more channel layers. For example, the ohmic contacts might be useful with a FET having a single thick channel layer, such as a bulk channel (instead of 2DEG) which has been uniformly doped with an n-type or p-type dopant, for which a conventional alloyed ohmic contact from the top surface cannot reach to the entire channel layer. A MESFET is an example.

Figure 6A:
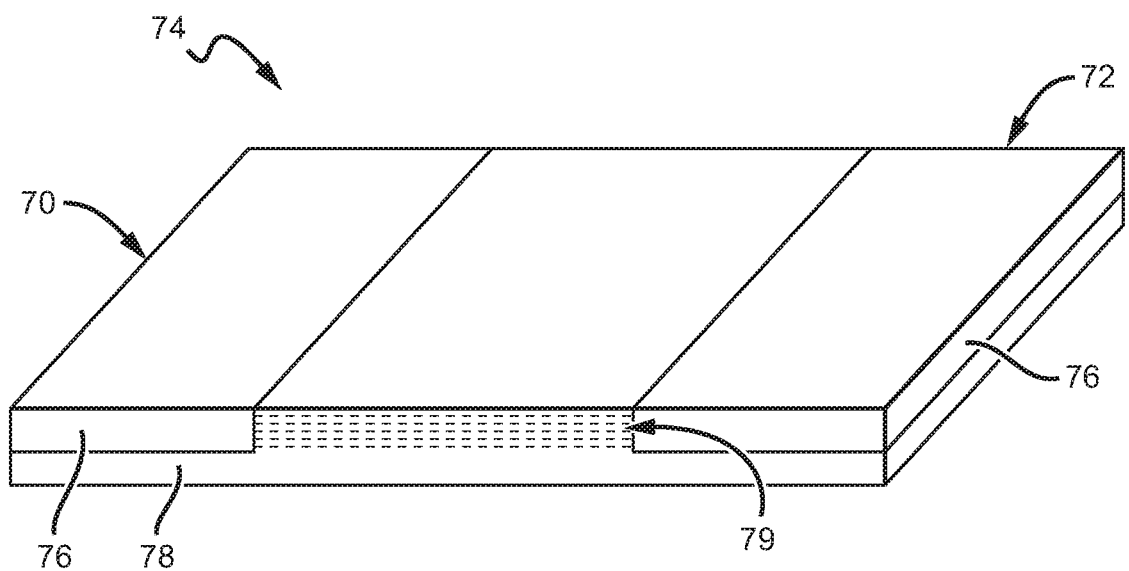
FIG. 6A is a perspective view of one embodiment of a multiple channel FET employing regrown ohmic contacts in accordance with the present invention.
Figure 6B:
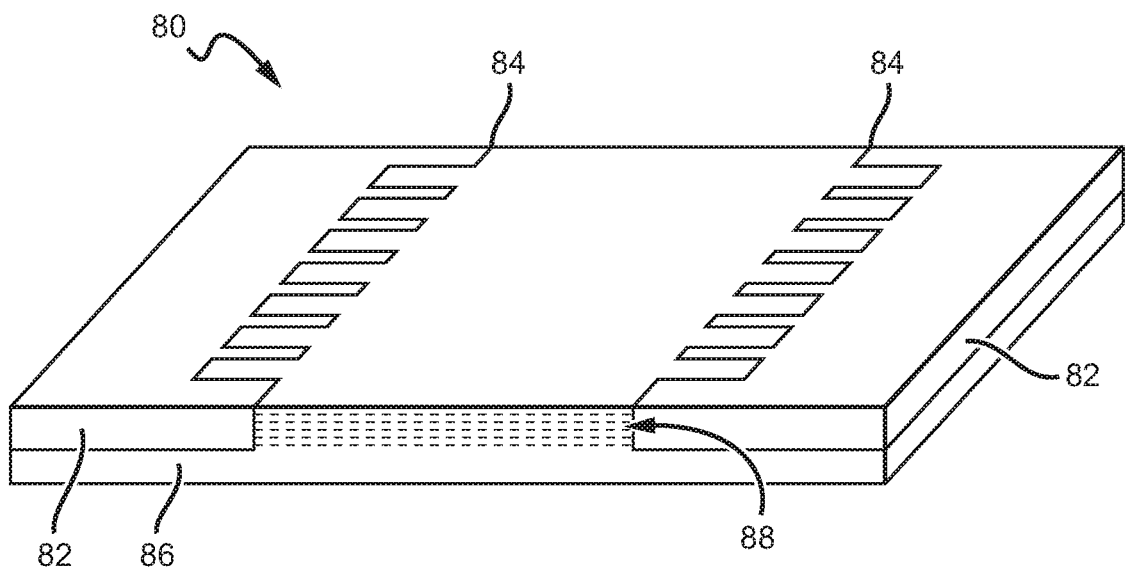
FIG. 6B is a perspective view of another possible embodiment of a multiple channel FET employing regrown ohmic contacts in accordance with the present invention.

A similar approach can be applied for more recent "regrown" ohmic contact technology. Here, rather than forming contacts by depositing metal, a regrown material such as, for example, $n^+GaN$, is directly deposited on the sidewalls of multiple channels—using MBE or MOCVD, for example. This is illustrated in FIGS. 6A and 6B. In FIG. 6A, ohmic source and drain contacts 70, 72 are formed on a multiple channel FET 74, using a regrown material 76 on a wafer 78 on which a multiple channel FET resides. Regrown material 76 laterally contacts the sidewalls of each channel layer 79 of the multiple channel FET.

A preferred embodiment using this concept is shown in FIG. 6B. Here, the regrown material 82 has an inside edge 84 which is perpendicular to the top surface of the wafer 86 on which the FET resides and which contacts the sidewalls of each channel layer 88, with inside edge 84 having a corrugated shape. A corrugated structure increases total contact periphery two dimensionally, resulting in reduced contact resistance per transistor gate width. The length, width, and shape of the corrugated structure is preferably optimized based on the materials' sheet resistance and the lateral contact resistance between the regrown material and the channels, so that overall contact resistance is minimized.

Examples of suitable regrown materials for various FET types are as follows:
n-type AlGaN/GaN FETs: n+GaN
p-type AlGaN/GaN FETs: p+GaN
n-type $AlGaO_3/Ga_2O_3$ FETs: $n+Ga_2O_3$ As noted above for the slit-shaped recess approach, the regrown material approach described herein can more generally find application with any FET having one channel layer or multiple channel layers.

Both the 'slit' and 'regrown' approaches offer much reduced contact resistance to the multiple channels over prior art methods by (1) having ohmic metals or regrown materials directly contact multiple channels simultaneously, and (2) increasing contact periphery by introducing slit/corrugated structures.

Figure 7:
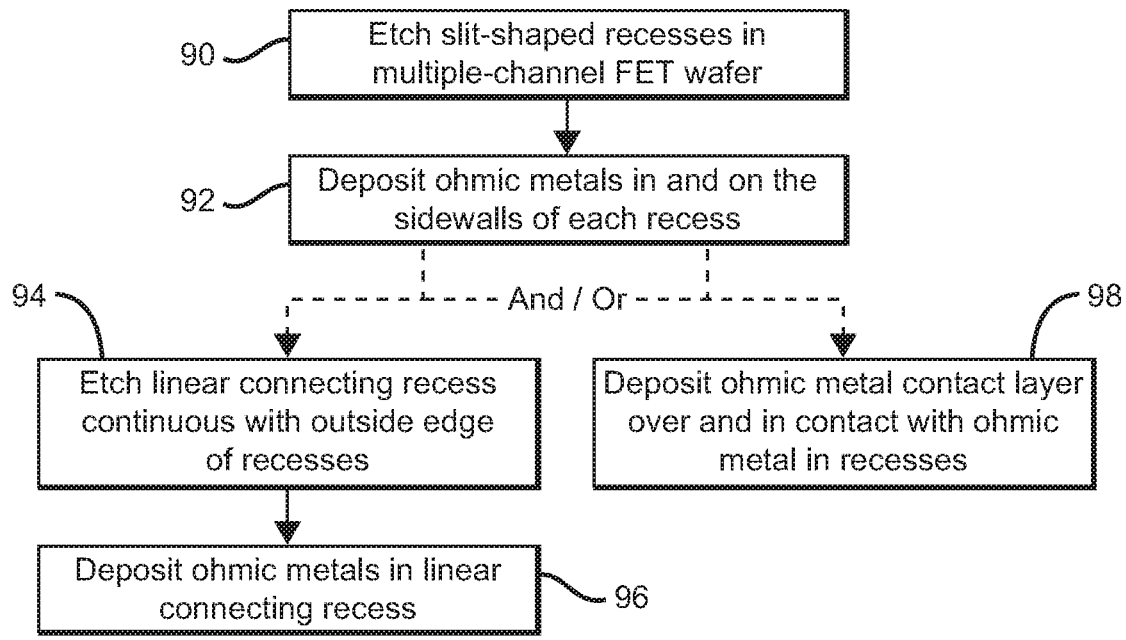
FIG. 7 is a flow chart illustrating one possible set of steps to form ohmic contacts using slit-shaped recesses in accordance with the present invention.

One possible method of forming ohmic contacts using slit-shaped recesses as described herein is shown in FIG. 7. In step 90, slit-shaped recesses are etched in a wafer on which a multiple channel FET is being fabricated. Each recess is etched to a depth at least equal to the depth of the lowermost channel layer of the FET. The recesses are aligned linearly with each other, and the line of recesses is oriented perpendicular to the direction of current flow between the FET's source and drain. In step 92, ohmic metals are deposited in and on the sidewalls of each of the slit-shaped recesses such that ohmic contact is made to each of the multiple channel layers.

Figure 5A:
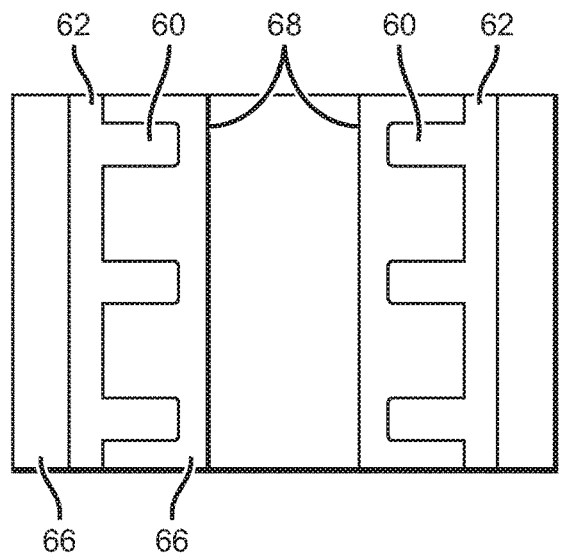
FIG. 5A is a plan view of one possible embodiment of a multiple channel FET employing ohmic contacts in accordance with the present invention.
Figure 5B:
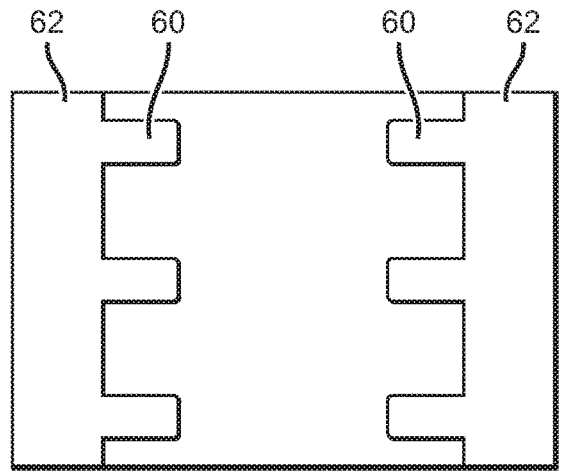
FIG. 5B is a plan view of another possible embodiment of a multiple channel FET employing ohmic contacts in accordance with the present invention.

Optionally, in step 94, a linear connecting recess is etched which is contiguous with the outside edge of each of the slit-shaped recesses (as illustrated in FIGS. 4B, 5A, and 5B). If a linear connecting recess has been etched, ohmic metals are also deposited in the linear connecting recess such that the ohmic metals interconnect the slit-shaped recesses and the linear connecting recess with the multiple channel layers (step 96).

Another optional step is shown in step 98: an ohmic metal contact layer is deposited on the top surface of the wafer over and in contact with the ohmic metals in each of the recesses (as illustrated in FIGS. 1 and 2). In accordance with the present invention, either steps 94/96 or step 98 can be performed, both can be performed, or neither can be performed.

The etching steps are preferably performed with a dry etch, such as a reactive ion etch (RIE) or an inductively-coupled plasma etch (ICP-RIE). The depositing of the ohmic metals preferably comprises evaporating or sputtering the ohmic metals sequentially in one process step. As noted previously, the sidewalls of the recesses may be sloped, with the angle of the sidewalls being between 45° and 90°. The etching and metal deposition steps are preferably performed before the FET's gate is formed.

Figure 8:
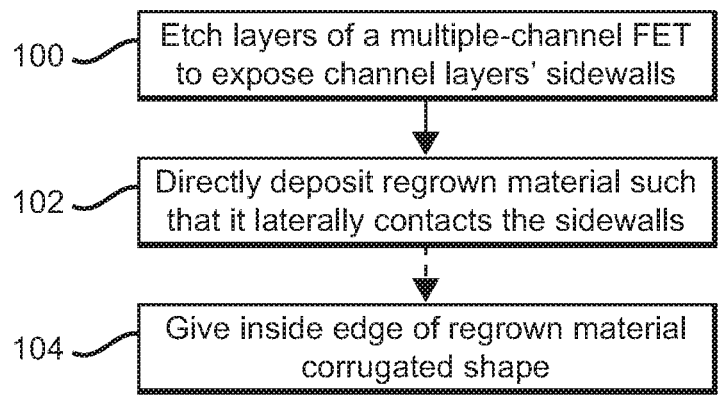
FIG. 8 is a flow chart illustrating one possible set of steps to form ohmic contacts using regrown material in accordance with the present invention.

One possible method of forming ohmic contacts using regrown material as described herein is shown in FIG. 8. In step 100, a multiple channel FET is etched to expose the sidewalls of each channel layer. In step 102, a regrown material such as, for example, n$^+$GaN, is directly deposited such that it laterally contacts the sidewalls of each of the channel layers. Optionally (and preferably), in step 104, the inside edge of the regrown material is given a corrugated shape. As noted above, the regrown material is preferably deposited using MBE or MOVCD.

The present ohmic contact for multiple channel FETs can be used in numerous applications. For example, power amplifier MMICs with high output power, low noise amplifier MMICs with high linearity, RF switch MMICs with low insertion loss and high isolation, and power switch transistors with low dynamic on-resistance and breakdown voltages are just several possible applications.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. An ohmic contact for a multiple channel FET having multiple channel layers, comprising:
    a plurality of slit-shaped recesses in a wafer on which the multiple channel FET resides, the lowermost of said multiple channel layers having an associated depth, each recess having associated sidewalls and a second depth at least equal to the associated depth of a lowermost channel layer of said multiple channel FET, said slit-shaped recesses aligned linearly with each other thereby forming a line of slit-shaped recesses, current flow between a source and a drain of said multiple channel FET having an associated direction, said line of slit-shaped recesses oriented perpendicular to the direction of current flow between said FET's source and drain; and
    ohmic metals in, and on the sidewalls of, each of said slit-shaped recesses such that ohmic contact is made to each of said multiple channel layers of said multiple channel FET;
    wherein the associated sidewalls of each of said slit-shaped recesses comprise an inside sidewall, together forming inside sidewalls which are perpendicular to said associated direction and side sidewalls perpendicular to said inside sidewalls, current flow between said source and drain conducted to and from said inside sidewalls and said side sidewalls;
    wherein each of said slit-shaped recesses has an inside edge, which current flows to or from, and an outside edge,
    further comprising a linear connecting recess which is contiguous with the outside edge of each of said slit-shaped recesses, said ohmic metals also in said linear connecting recess such that said ohmic metals interconnect said slit-shaped recesses and said linear connecting recess with said multiple channel layers.

2. The ohmic contact of claim 1, further comprising an ohmic metal contact layer on the top surface of said wafer over and in contact with said ohmic metals in each of the slit-shaped recesses in said line of slit-shaped recesses.

3. The ohmic contact of claim 2, wherein said ohmic metal contact layer has an inside edge and an outside edge, said line of slit-shaped recesses set back from said ohmic metal contact layer's inside edge by a distance ≥0 µm such that each of said slit-shaped recesses is completely covered by said ohmic metal contact layer.

4. The ohmic contact of claim 2, wherein said ohmic metal contact layer has an inside edge and an outside edge and an associated width defined as a distance between said inside and outside edges, and each of said slit-shaped recesses has an associated common width defined in the same direction as said ohmic metal contact layer width, the associated width of said ohmic metal contact layer greater than or equal to the common width of said slit-shaped recesses.

5. The ohmic contact of claim 4, wherein the associated width of said ohmic metal contact layer is equal or nearly equal to the common width of said slit-shaped recesses.

6. The ohmic contact of claim 1, wherein said multiple channel FET is a n-type AlGaN/GaN FET and said ohmic metals comprise Ti, Al, Mo, and/or Au, or said multiple channel FET is a p-type AlGaN/GaN FET and said ohmic metals comprise Pd, Ni, Pt and/or Au.

7. The ohmic contact of claim 1, wherein said multiple channel FET is a GaAs/InGaAs FET and said ohmic metals comprise AuGe, Ni, and/or Au.

8. The ohmic contact of claim 1, wherein said multiple channel FET is an $AlGa_2O_3/Ga_2O_3$ FET and said ohmic metals comprise Ti and Au.

9. The ohmic contact of claim 1, wherein said ohmic contact is a source or drain contact for said FET.

10. The ohmic contact of claim 1, wherein said sidewalls are sloped, the angle of said sidewalls being between 45° and 90°.

11. A multiple channel FET residing on a wafer and having multiple channel layers, comprising:
a source and a drain, each comprising:
a plurality of slit-shaped recesses in the wafer on which said multiple channel FET resides, a lowermost of said multiple channel layers having an associated depth, each recess having associated sidewalls and a second depth at least equal to the associated depth of the lowermost channel layer of said FET, said slit-shaped recesses aligned linearly with each other thereby forming a line of slit-shaped recesses, current flow between a source and a drain of said multiple channel FET having an associated direction, said line of slit-shaped recesses oriented perpendicular to the direction of current flow between said FET's source and drain, each of said slit-shaped recesses having an inside edge which current flows to, or from, and an outside edge;
a linear connecting recess which is contiguous with the outside edge of each of said slit-shaped recesses; and
ohmic metals in, and on the sidewalls of, each of said slit-shaped recesses and in said linear connecting recess such that said ohmic metals interconnect said slit-shaped recesses and said linear connecting recess, such that ohmic contact is made to each of said multiple channels;
wherein the associated sidewalls of each of said slit-shaped recesses comprise an inside sidewall, together forming inside sidewalls which are perpendicular to said associated current flow direction and side sidewalls perpendicular to said inside sidewalls, current flow between said source and drain conducted to and from said inside sidewalls and said side sidewalls.

12. A multiple channel FET residing on a wafer and having multiple channel layers, comprising:
a source and a drain, each comprising:
a plurality of slit-shaped recesses in the wafer on which said multiple channel FET resides, a lowermost of said multiple channel layers having an associated depth, each recess having associated sidewalls and a second depth at least equal to the associated depth of the lowermost channel layer of said FET, said slit-shaped recesses aligned linearly with each other thereby forming a line of slit-shaped recesses, current flow between a source and a drain of said multiple channel FET having an associated direction, said line of slit-shaped recesses oriented perpendicular to the direction of current flow between said FET's source and drain, each of said slit-shaped recesses having an inside edge which current flows to, or from, and an outside edge;
a linear connecting recess which is contiguous with the outside edge of each of said slit-shaped recesses;
ohmic metals in, and on the sidewalls of, each of said slit-shaped recesses and in said linear connecting recess such that said ohmic metals interconnect said slit-shaped recesses and said linear connecting recess, such that ohmic contact is made to each of said multiple channels;
a first ohmic metal contact layer on the top surface of said wafer over and in contact with said ohmic metals in each of the slit-shaped recesses in said source's line of slit-shaped recesses; and
a second ohmic metal contact layer on the top surface of said wafer over and in contact with said ohmic metals in each of the slit-shaped recesses in said drain's line of slit-shaped recesses;
wherein each of said first and second ohmic metal contact layers has an inside edge and an outside edge, said source's line of slit-shaped recesses set back from said first ohmic metal contact layer's inside edge by a distance $\geq 0$ µm and said drain's line of slit-shaped recesses set back from said second ohmic metal contact layer's inside edge by a distance $\geq 0$ µm;
such that each of said slit-shaped recesses is completely covered by said first or second ohmic metal contact layer.

13. An ohmic contact for a multiple channel FET, comprising:
a regrown material on a wafer on which the multiple channel FET resides, said multiple channel FET having multiple channel layers each with associated sidewalls, said regrown material laterally contacting at least some of the sidewalls of each channel layer of said multiple channel FET;
wherein said wafer has an associated top surface, said regrown material having an inside edge which is perpendicular to the top surface of said wafer, said inside edge having a corrugated shape, such that said corrugated inside edge laterally contacts said channel layer sidewalls two dimensionally.

14. The ohmic contact of claim 13, wherein said multiple channel FET is a n-type AlGaN/GaN FET and said regrown material is n$^+$GaN, or said multiple channel FET is a p-type AlGaN/GaN FET and said regrown material is p$^+$GaN, or said multiple channel FET is a n-type AlGaO$_3$/Ga$_2$O$_3$ FET and said regrown material is n+Ga$_2$O$_3$.

* * * * *